United States Patent
Pokorny

(10) Patent No.: US 7,823,103 B2
(45) Date of Patent: Oct. 26, 2010

(54) METHOD AND SYSTEM OF INTRODUCING HIERARCHY INTO DESIGN RULE CHECKING TEST CASES AND ROTATION OF TEST CASE DATA

(75) Inventor: William F. Pokorny, Mansfield, PA (US)

(73) Assignee: International Business Machines Corporation, Armonk, NY (US)

( * ) Notice: Subject to any disclaimer, the term of this patent is extended or adjusted under 35 U.S.C. 154(b) by 636 days.

(21) Appl. No.: 11/552,245

(22) Filed: Oct. 24, 2006

(65) Prior Publication Data

US 2008/0109772 A1    May 8, 2008

(51) Int. Cl.
G06F 17/50 (2006.01)
G06F 9/455 (2006.01)
G03F 1/00 (2006.01)
G03C 5/00 (2006.01)

(52) U.S. Cl. ............... 716/5; 716/2; 716/4; 716/11; 716/19; 716/20; 716/21; 430/5; 430/30

(58) Field of Classification Search ............ 716/2, 716/5, 11, 19–21; 430/5, 30
See application file for complete search history.

(56) References Cited

U.S. PATENT DOCUMENTS

| | | | |
|---|---|---|---|
| 4,729,096 A | | 3/1988 | Larson |
| 5,497,334 A | * | 3/1996 | Russell et al. ............ 716/5 |
| 5,729,096 A | | 3/1998 | Liu et al. |
| 5,787,006 A | | 7/1998 | Chevallier et al. |
| 5,987,240 A | * | 11/1999 | Kay ............ 716/5 |
| 6,023,567 A | | 2/2000 | Osler et al. |
| 6,063,132 A | | 5/2000 | DeCamp et al. |
| 6,243,854 B1 | * | 6/2001 | Lavin et al. ........... 716/19 |
| 6,370,679 B1 | * | 4/2002 | Chang et al. .......... 716/19 |
| 6,415,421 B2 | * | 7/2002 | Anderson et al. ......... 716/4 |
| 6,571,374 B1 | * | 5/2003 | Runyon et al. .......... 716/5 |
| 6,611,946 B1 | * | 8/2003 | Richardson et al. ........ 716/5 |
| 6,658,633 B2 | * | 12/2003 | Devins et al. ........... 716/5 |

(Continued)

FOREIGN PATENT DOCUMENTS

JP    2002197134    2/2004

OTHER PUBLICATIONS

Scheffer;"Some conditions under which hierarchical verification is O(N)"; May 2003 ; Computer-Aided Design of Integrated Circuits and Systems, IEEE Transactions on; vol. 22, Issue 5, pp. 643-646.*

(Continued)

*Primary Examiner*—Helen Rossoshek
(74) *Attorney, Agent, or Firm*—Richard Kotulak; Roberts Mlotkowski Safran & Cole

(57) ABSTRACT

A method and system for validating a design rule checking program. The method and system includes creating a hierarchal structure such that each layer of the hierarchal structure corresponds to a process layer of a device or subregion of a shape. The method and system further includes inserting the created hierarchical structure into a DRC program and running the DRC program at least once with hierarchical optimization options turned off. The method and system compares the expected results with actual results. The differences between the expected results and the actual results actual results indicate errors in the DRC program.

18 Claims, 11 Drawing Sheets

U.S. PATENT DOCUMENTS

| | | | |
|---|---|---|---|
| 6,718,521 B1* | 4/2004 | Bentlage et al. | 716/4 |
| 6,732,338 B2 | 5/2004 | Crouse et al. | |
| 6,756,242 B1* | 6/2004 | Regan | 438/14 |
| 6,769,099 B2 | 7/2004 | Li et al. | |
| 6,775,806 B2 | 8/2004 | Li | |
| 6,816,997 B2 | 11/2004 | Teh et al. | |
| 6,868,532 B2* | 3/2005 | Nadeau-Dostie et al. | 716/4 |
| 6,871,332 B2 | 3/2005 | Le et al. | |
| 6,883,149 B2 | 4/2005 | Li et al. | |
| 6,901,574 B2* | 5/2005 | LaCour et al. | 716/19 |
| 6,957,403 B2* | 10/2005 | Wang et al. | 716/3 |
| 7,007,207 B2* | 2/2006 | Emek et al. | 714/703 |
| 7,096,440 B2* | 8/2006 | Fechser | 716/5 |
| 7,181,702 B2* | 2/2007 | Horn | 716/2 |
| 7,237,210 B2* | 6/2007 | Likovich et al. | 716/5 |
| 7,254,791 B1* | 8/2007 | Agrawal et al. | 716/4 |
| 7,356,788 B2* | 4/2008 | Chang et al. | 716/5 |
| 7,434,184 B2* | 10/2008 | Li | 716/5 |
| 7,478,348 B2* | 1/2009 | Pokorny | 716/5 |
| 7,529,655 B2* | 5/2009 | Gabele et al. | 703/16 |
| 2002/0059054 A1* | 5/2002 | Bade et al. | 703/20 |
| 2003/0125920 A1* | 7/2003 | Matsuoka et al. | 703/15 |
| 2004/0088682 A1* | 5/2004 | Thompson et al. | 717/124 |
| 2005/0138591 A1* | 6/2005 | Shirai et al. | 716/11 |
| 2006/0190871 A1* | 8/2006 | Likovich et al. | 716/5 |

OTHER PUBLICATIONS

Modarres et al.; "A Formal Approach to Design-Rule Checking"; Jul. 1987; Computer-Aided Design of Integrated Circuits and Systems, IEEE Transactions on; vol. 6, Issue 4, pp. 561-573.*

Niewczas et al.; "A pattern matching algorithm for verification and analysis of very large IC layouts"; Apr. 1998; ISPD '98: Proceedings of the 1998 international symposium on Physical design; Publisher: ACM.*

JP2004037989.

* cited by examiner

A

A  B  C  D  E

METHOD AND SYSTEM OF INTRODUCING HIERARCHY INTO DESIGN RULE CHECKING TEST CASES AND ROTATION OF TEST CASE DATA

FIELD OF THE INVENTION

The invention relates to a method and system for introducing hierarchy into design rule checking program test cases and providing automatic rotation of test case data.

BACKGROUND DESCRIPTION

Integrated circuits and their physical packaging are described by physical designs in the form of 2-dimensional geometric models. The increasing data volume accomplished by the increasing complexity of these designs is becoming a significant problem for engineering design automation, since it overstresses the software design tools which, in turn, impact the design cycle time, design cost and time to market.

Physical design data is analyzed many times to verify that physical mask constraints are not exceeded, electrical performance is satisfactory, and the physical design implements the logical design intent. For example, it is often necessary to determine wide or fat portions of material in a very large scale integrated (VLSI) semiconductor mask layout for the purposes of design rule checking (DRC), data preparation prior to mask build and the like. This determination is problematic with modern tools because the area around the base shape or cell which must be searched is large causing the effective flattening of the layout many times over. Thus, vast CPU and memory resources are consumed in the process and often for little real value.

The standard approach to managing design complexity has been to optimize the design itself, but verify, or check the design in flattened form. However, the computation of the high level representation of the physical partitions can be a significant problem when the data volume in a partition is substantial. Moreover, any attempt to break the hierarchical design constraints using ad-hoc design fixes invalidates the integrity of the partitioning and reduces the verification process to a completely flat analysis problem. Finally, the methodology constraints typically prevent the designer from fully exploiting the available density offered by the physical design technology.

Thus, DRC tools are validated using flat designs with little or no hierarchy test cases because hierarchy test cases must be developed manually. Due to the time requirements for developing a complete set of hierarchy test cases, hierarchy test cases are not very practical and tend not to be used to verify DRC programs. Thus, there is a need for an automated method of generating valid test cases for more coverage in DRC tool validation.

SUMMARY OF THE INVENTION

In a first aspect of the invention, a method of validating a design rule checking program includes creating a hierarchal structure such that each layer of the hierarchal structure corresponds to a process layer of a device or subregion of a shape. The method further includes inserting the created hierarchical structure into a DRC program and running the DRC program at least once with hierarchical optimization options turned off. The method compares the expected results with actual results. The differences between the expected results and the actual results indicate errors in the hierarchical design rule checking program.

In another aspect of the invention, the method includes providing a DRC program and providing a first test case. The first test case is modified by placing the first test case into a hierarchal structure, wherein each layer of the hierarchal structure is built from a single layer of a design or subregion of a shape. The method further includes executing the DRC program using the modified first test case as an input. The DRC program output results are compared with expected results for determining validity of the DRC program when run against hierarchical test data.

In yet another aspect of the invention, a system comprises computer code run on a machine and configured to:
  create a hierarchical structure of layout design;
  insert the hierarchical structure of layout design into a DRC program;
  rotate the layout data about an x and y axis for testing other orientations of a same shape;
  run the DRC program at least once with hierarchical optimization options turned off; and
  compare expected results with actual results, wherein differences between the expected results and the actual results indicate errors in dealing with hierarchy in the DRC program.

DETAILED DESCRIPTION OF EMBODIMENTS OF THE INVENTION

The invention relates to a method and system for introducing hierarchy into design rule checking program test cases. In embodiments, a method and system of testing the accuracy and robustness of a design rule checking (DRC) tool is provided. The method and system compares DRC outputs to expected results. Discrepancies in actual results versus expected results identify where problems exist within the DRC tool.

The method and system modifies existing test cases and provides the modified data as inputs to the DRC tool. In embodiments, one modification may be an automatic rotation of the test case data. For example, the method may rotate a particular orientation 45 degrees and feed the new input data to the DRC tool. In further embodiments, a modification may be automatically adding hierarchy into the DRC test cases. For example, one or more layers or levels can be put into a parallel nesting structure, or there may be various options for fracturing shapes and putting portions of original design shapes into differing nesting structures.

In embodiments, the creation of a tool which inserts hierarchy automatically before the DRC program is run, greatly improves the testing coverage. With the use of such a tool, it is possible to go from almost no testing coverage for hierarchical layout interactions to coverage so at least the most basic mistakes are now realized and can be corrected. In implementation, the method and system can digest test layout data to understand levels present. The system and method can optionally flatten the existing layout so the hierarchy created is standardized; that is, any hierarchy may be limited to the forms of hierarchy inserted. In further implementations, the system and method can insert hierarchy in various manners as specified by program options.

By way of non-limiting illustrative example, the created hierarchical structure may be placed into a DRC program in the following manners: (i) each layer or level is put in a parallel cell nesting structure; (ii) one layer or level is put into a parallel nesting structure; and (iii) various options for fracturing shapes and putting portions of original design shapes into differing nesting structures. The system and method then runs a known DRC program, at least once with hierarchical optimization options turned off. The system and method compares expected results with actual results, and the differences indicate errors in dealing with hierarchy in the DRC program layout design data. In embodiments, the differences between the expected results and actual results can also be used to indicate errors in dealing with the layout design data. This function is a stand alone program, but it can be implemented as part of the hierarchical operations performed at the start of most DRC program runs. Additionally, the hierarchical optimizations have the aim of insuring no matter the hierarchy introduced that the checking results are valid.

Figure 1:
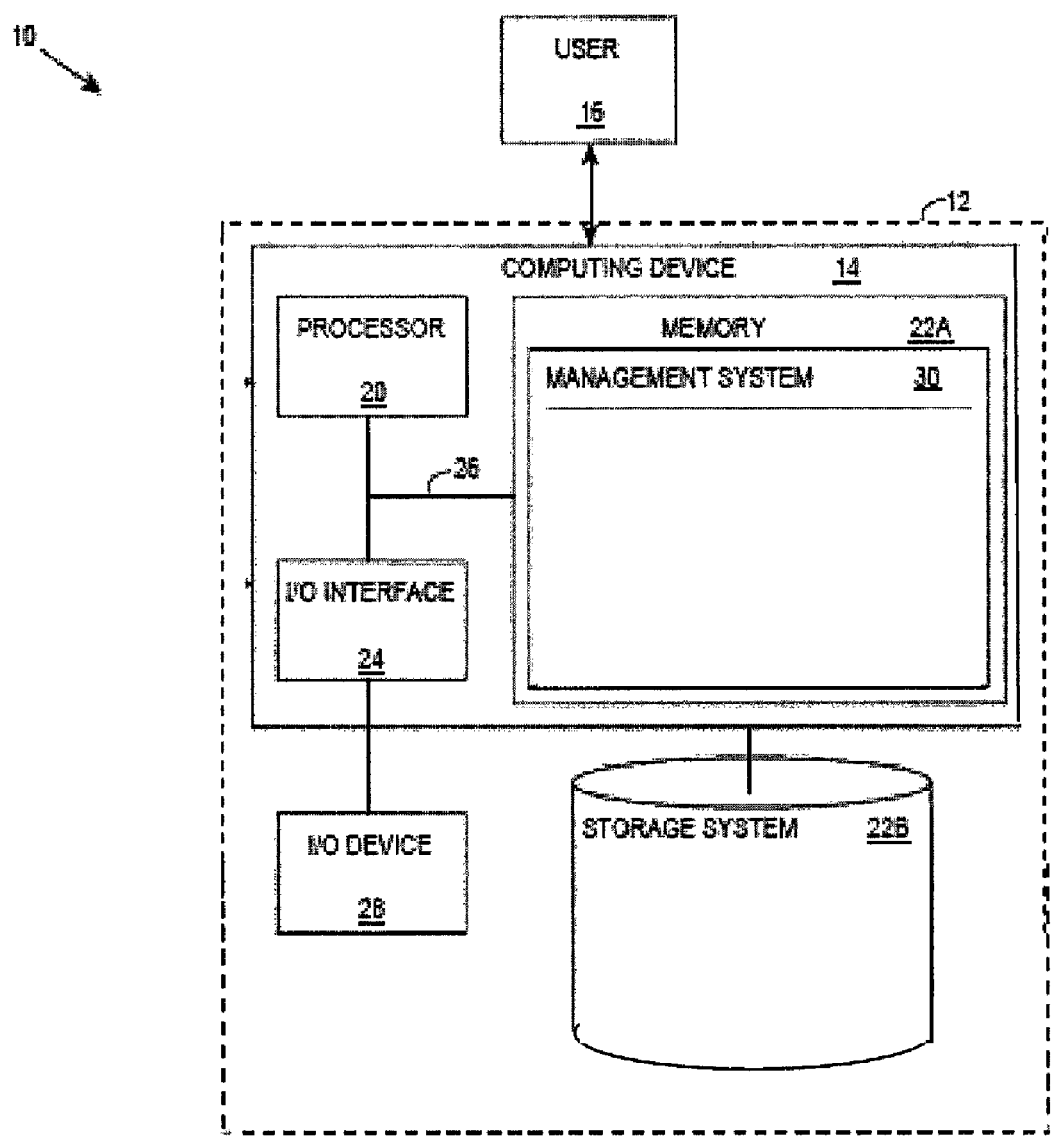
FIG. 1 is representative of a system implementing the invention.

FIG. 1 shows an illustrative environment 10 for managing the processes in accordance with the invention. To this extent, the environment 10 includes a computer infrastructure 12 that can perform the processes described herein. In particular, the computer infrastructure 12 includes a computing device 14 that comprises a management system 30, which makes computing device 14 operable to introduce hierarchy into design rule checking program (DRC) test cases and provide automatic rotation of the test case data in accordance with the invention, e.g., process described herein. The computing device 14 includes a processor 20, a memory 22A, an input/output (I/O) interface 24, and a bus 26. Further, the computing device 14 is in communication with an external I/O device/resource 28 and a storage system 22B.

As is known in the art, in general, the processor 20 executes computer program code, which is stored in memory 22A and/or storage system 22B. While executing computer program code, the processor 20 can read and/or write data from look-up tables which are the basis for the execution of the commands to be performed on the computer, to/from memory 22A, storage system 22B, and/or I/O interface 24. The bus 26 provides a communications link between each of the components in the computing device 14. The I/O device 28 can comprise any device that enables an individual to interact with the computing device 14 or any device that enables the computing device 14 to communicate with one or more other computing devices using any type of communications link.

The computing device 14 can comprise any general purpose computing article of manufacture capable of executing computer program code installed thereon (e.g., a personal computer, server, handheld device, etc.). However, it is understood that the computing device 14 is only representative of various possible equivalent computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

While performing the process described herein, one or more computing devices in the computer infrastructure 12 can communicate with one or more other computing devices external to computer infrastructure 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

In embodiments, the invention provides a business method that performs the process steps of the invention on a subscription, advertising, and/or fee basis. That is, a service provider, such as a Solution Integrator, could offer to perform the processes described herein. In this case, the service provider can create, maintain, support, etc., a computer infrastructure that performs the process steps of the invention for one or more customers. In return, the service provider can receive payment from the customer(s) under a subscription and/or fee agreement.

Additionally, the method as described herein is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
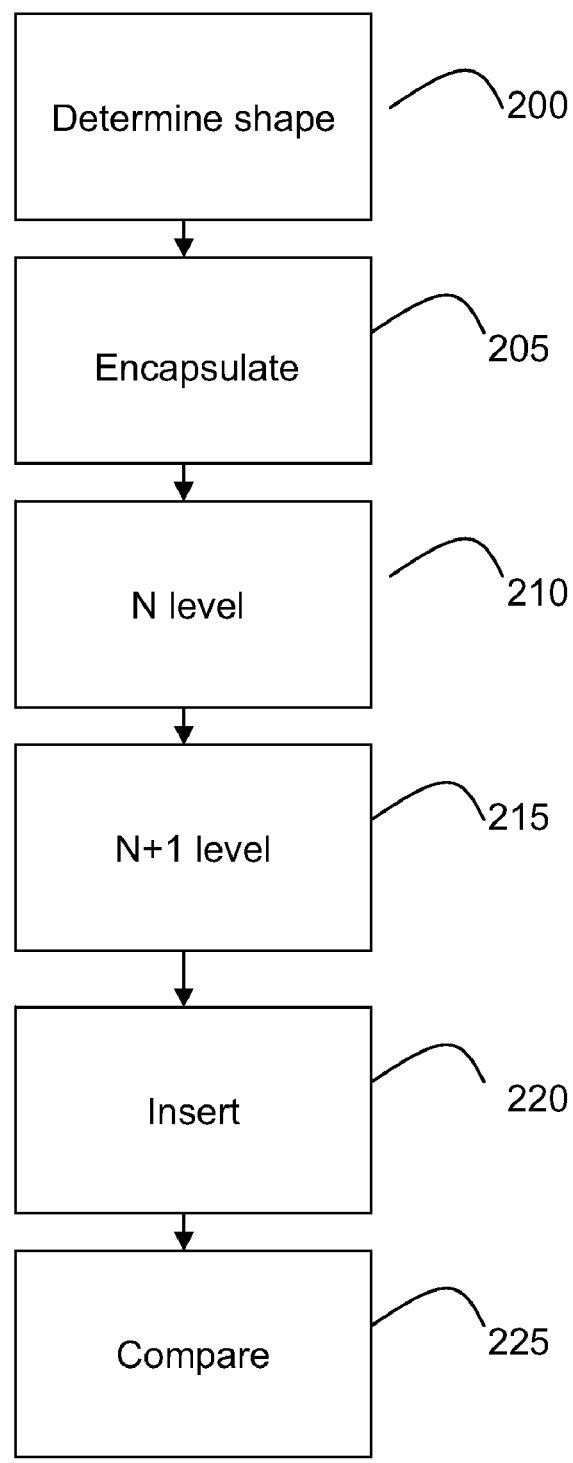
FIG. 2 is a flow diagram showing steps implementing an embodiment of the invention.

FIG. 2 shows a flow diagram of an embodiment of the invention. FIG. 2 (and any other flow diagrams described herein) may equally represent a high-level block diagram of the invention. The steps of FIG. 2 (and any other flow diagrams described herein) may be implemented and executed from either a server, in a client server relationship, or they may run on a user workstation with operative information conveyed to the user workstation to create the navigation outlined above. Additionally, the invention can take the form of an entirely hardware embodiment, an entirely software embodiment or an embodiment containing both hardware and software elements.

In an embodiment, the invention is implemented in software, which includes but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any system that can contain, store, communicate, propagate, or transport the program for use by or in connection with the instruction execution system, system, or device (as discussed in detail above). The medium can be an electronic, magnetic, optical, electromagnetic, infrared, or semiconductor system (or system or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Referring back to FIG. 2, at step 200, the system of the invention determines a shape to be encapsulated. At step 205, the shape is encapsulated. Subsequent levels in a hierarchy can be created using the base shape. For example, at step 205, another level "N" of the hierarchy can be created using the previous encapsulated data. At step 215, another level, N+1, of the hierarchy can be created using the encapsulated data of the previous level, etc. In embodiments, each metal layer (e.g., mask or process level) of a device can be placed into one level of the hierarchy. In further embodiments, the system and method of the invention can break the shapes into geometric subregions of a grid. Each of the subregions may then be encapsulated and placed next to an adjacent encapsulation to provide the hierarchy.

At step 220, the system and method inserts the structure into a DRC program and then runs a DRC program at least once with hierarchical optimization options turned off. The hierarchy can be inserted by various methods as specified by program options. By way of illustrative examples, (i) each layer or level is put in a parallel cell nesting structure, (ii) one layer or level is put into a parallel nesting structure or (iii) various options for fracturing shapes and putting portions of original design shapes into differing nesting structures. At step 225, the system and method compares expected results with actual results, and the differences indicate errors in dealing with hierarchy in the layout design data.

Figure 3:
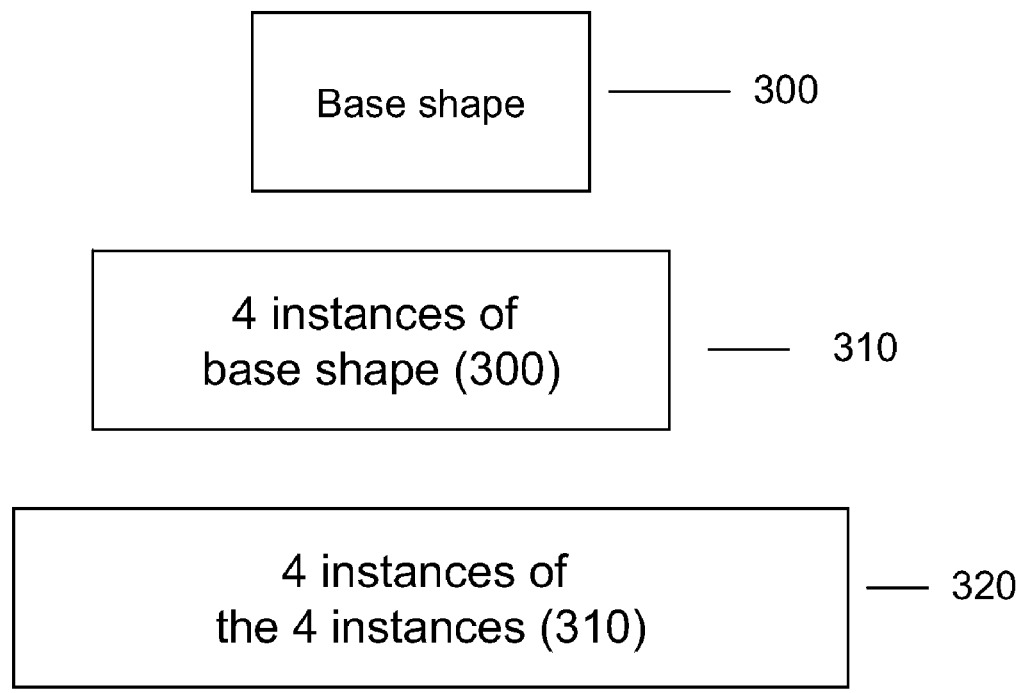
FIG. 3 shows a graphical representation of a hierarchy in accordance with an embodiment of the invention.

FIG. 3 shows a graphical representation of a hierarchy in accordance with an embodiment of the invention. By way of example, a singe shape may represent a memory cell instance at a certain location of a chip design. The single shape is encapsulated for a location, as represented at reference numeral 300. This same shape may then be used four times, for example, at a different location. Instead of having a flat structure, the system and method of the invention uses the base shape in another layer of the hierarchy by using the four instances of the base in a second level of the hierarchy, as represented at reference numeral 310. Then, for example, four instances of the encapsulated data (of the level represented by reference numeral 310) located at another level of the chip is generate in another level of hierarchy, as represented at reference numeral 320. In this way, instead of having an exponentially large flat structure, the system and method of the invention creates three (or more layer) layers of a hierarchical structure, to be used with a known DRC program.

Figure 4:
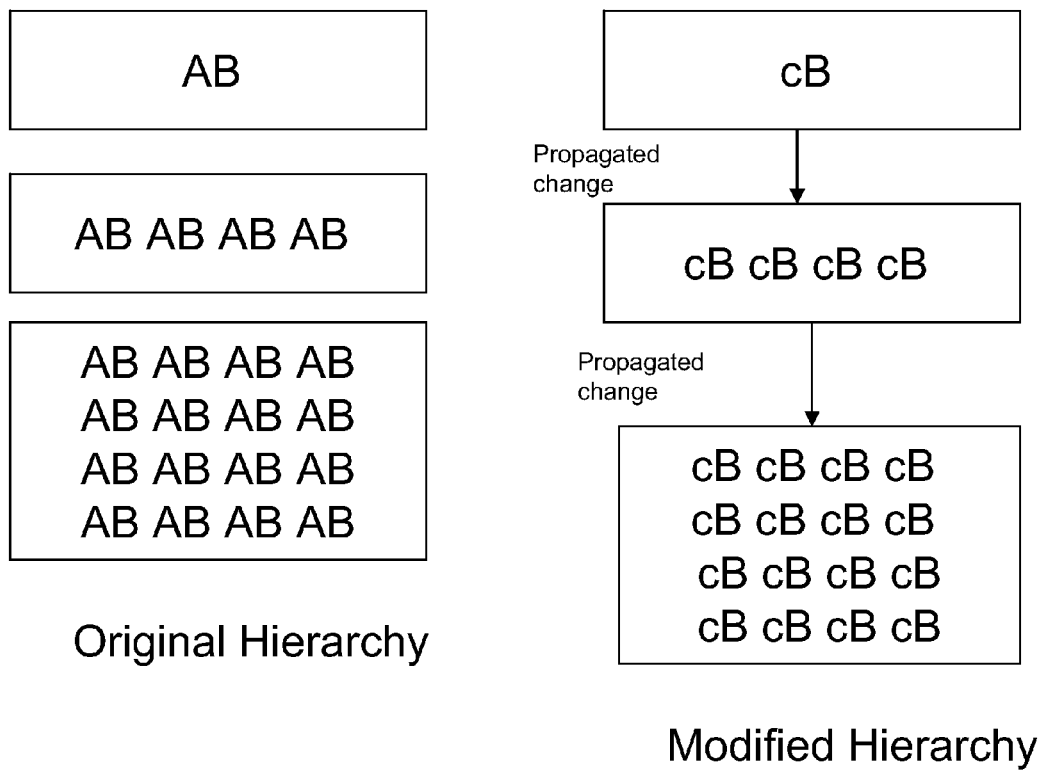
FIG. 4 shows an example according to an embodiment of the invention.

By using this hierarchical structure type, it is now possible to change the memory cell, for example, in any subsequent level by automatically propagating a change in the base level to the remaining hierarchical structures, as graphically represented in FIG. 4. This is in contrast to a conventional system which would require the memory cell to be changed at every instance, a very time consuming and cumbersome process. FIG. 4 also graphically shows that subsequent levels in the hierarchical structure are created using a base shape of a previous level in the hierarchical structure By way of example, referring to FIG. 4, the base structure "AB" may be changed to "cB". In this example, the system and method of the present invention will change all instances of "AB" to "cB" by propagating the change throughout the entire hierarchy. In this manner, the memory cell, for example, will not have to be changed manually for each instance.

Figure 5:
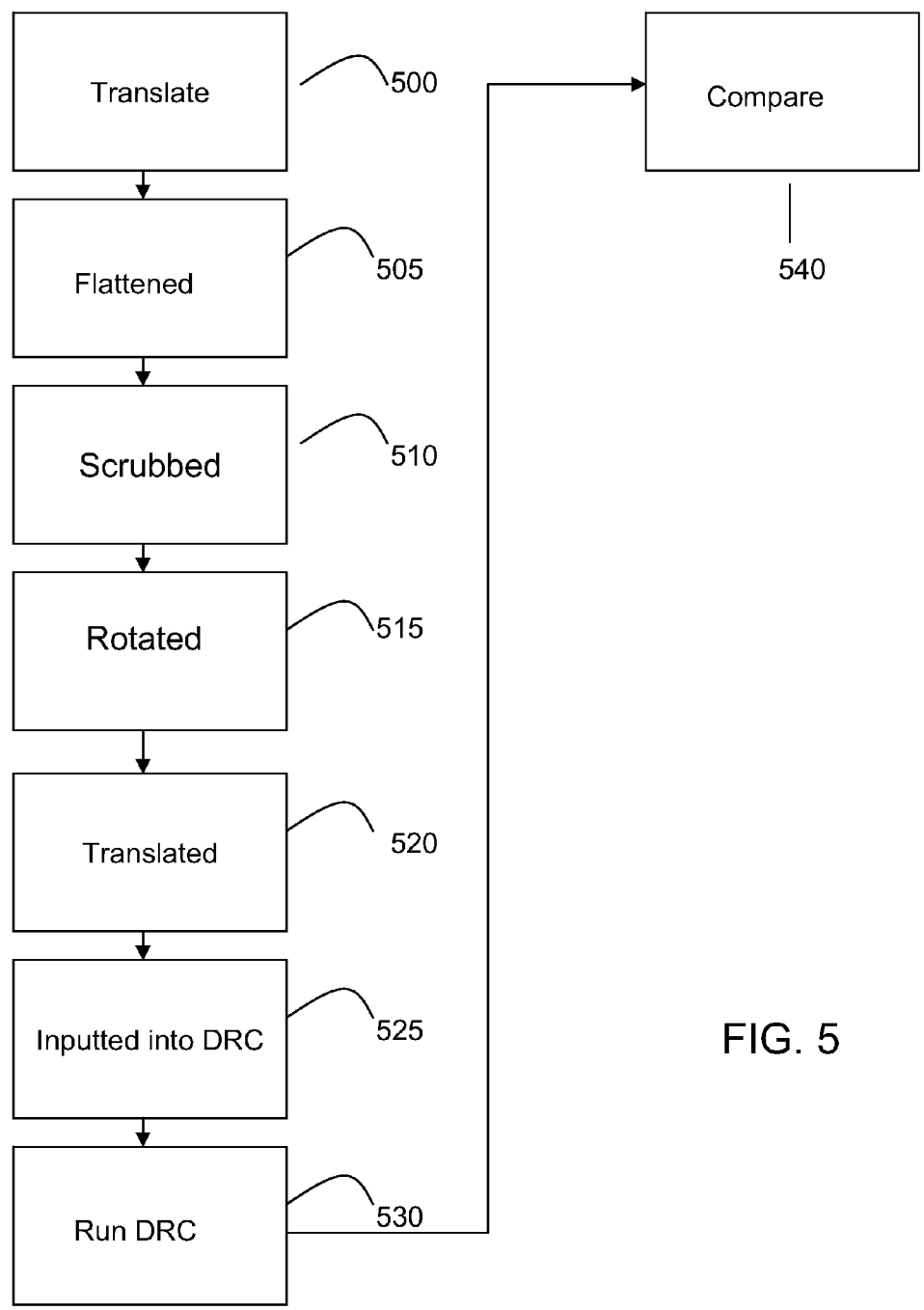
FIG. 5 is a flow diagram showing steps implementing an embodiment of the invention.

FIG. 5 is a flow diagram implementing steps of the invention. At step 500, layout data is translated from external formats into a common format. In embodiments, the common format may be GDSII, well known to those of skill in the art. At step 505, the data is flattened. At step 510, the data is scrubbed for snapping issues so the results can be rotated. SnapTo45™ function created by Niagara Software may be implemented for performing the process at step 510. The rotation, in embodiments, may be considered a modification of the layout data and/or test data.

At step 515, the data is rotated using, for example, 3d matrix multiplications. Generating derivative layouts may be accomplished by rotating about the x and y axis (two dimensions), or about three dimensional space. In the case of rotation in three dimensional space, the test results may be projected back to two dimensional space. In embodiments, the rotation may be 45 degrees; although other rotation angles are also contemplated by the invention.

At step 520, the data is translated into an input format and written to a new file. At step 525, the results may be inputted into a known DRC tool such as, for example, Dracula and Assura by Cadence™, Calibre™ by Mentor™ Graphics™ or Hercules™ by Synopsys™ or Quartz™ by Magma Design Automation™, to name a few. It should be understood that the system and method of the invention may also be implemented in proprietary systems. At step 530, the DRC program is run against the generated data, proceeding into a shapediff flow, for example, comparing expected results to real results from the DRC program (step 540). In further implementations, it is possible to compare the flat test data with the modified hierarchical data. It is noted that if the modification from the flat test data to the hierarchical data is not performed correctly, it will show up when testing the DRC program.

In further embodiments, a shape may described in many different ways such as, for example, its vertices, build level, topology (inside and outside), etc. In the present invention, each of the descriptions may be used since, in the hierarchical methodology described herein, the shape encoding variations do not have to be maintained in the test case. That is, it is possible to use all of the op-code encoding language supported by a language to describe the shape geometry due mainly to the resources saved by only having to make a single change which is then propagated for each instance of that particular shape. Thus, by running the test case against all of the encodings, it is now possible to uncover additional errors in the design rule checker. Also, it is now possible to vary the test case to stress the DRC tool.

Figure 6A:
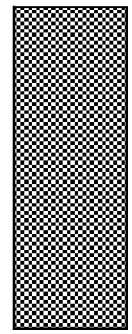
FIGS. 6A-6G show examples according to an embodiment of the invention.
Figure 6B:
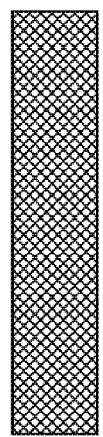
Figure 6B:
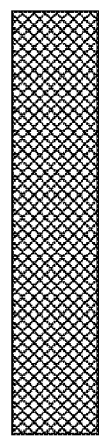
Figure 6B:
Figure 6B:
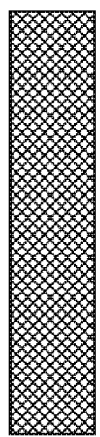
Figure 6B:

In the languages used to describe mask data such as GL/1, GDSII, Oasis, etc. it is possible to describe the same shapes that end up on the mask in many different ways, as contemplated by the invention. For example, in an aspect, the invention is the automatic generation of encoding variants for the shapes used to build semiconductor masks for the purposes of testing the DRC programs ability to correctly check them to rules for manufacturing. In FIG. 6A, a single rectangle labeled A. It is possible to describe many additional shapes that when printed upon the mask will be exactly the same as the original shape A, but that use different encoding methods for the shape. For this example, four additional shapes are encoded as shown in FIG. 6B. More specifically, a DRC program would be expected to measure the geometric properties of each of the shapes A-E in the same way.

In embodiments, shapes are described using x, y locations in a two dimensional x, y plane and with edge construction based upon these locations. These locations are typically called shape vertices and they are represented as dots, in FIG. 6C, for each of the encoding variants.

In the encoding for shape A, a single vertex at 1 denotes the lower left hand corner of a rectangle which is followed by an offset from that location in both the x and y dimension that describes the location of the other corner of the rectangle at 2. The encoding for A therefore looks roughly like: RECTANGLE X, Y, X-offset, Y-offset. The encodings for B, C and D are of a path or line type and all require a starting and ending vertex for the path. B puts the vertices for the path exactly at the top and bottom of the shape and then describes the width of the line, 3, centered about the path from 1 to 2. Shape C puts the vertices for the path at ½ the width of the line, 3, from the ends of the shape. Shape D puts the vertices in the same locations as C but describes the point set of the shape in the plain as those points covered when the square at 3 is swept from vertex 1 to vertex 2. These three path like encodings for shapes B-D may be represented as:

PATH_WITHOUT_ENDS X1, Y1, X2, Y2, Width
PATH_WITH_ENDS X1, Y1, X2, Y2, Width
PATH_SWEEP_SQUARE X1 Y1, X2, Y2 Width Finally, shape E is described with 4 vertices, labeled 1, 2, 3 and 4 in an order describing the edges that when connected bound the point set for the shape. Shapes encoded in this way are often called polygons and the encoding for this shape may be represented as:

POLYGON X1, Y1, X1, Y2, X2, Y2, X2, Y1

Figure 6C:
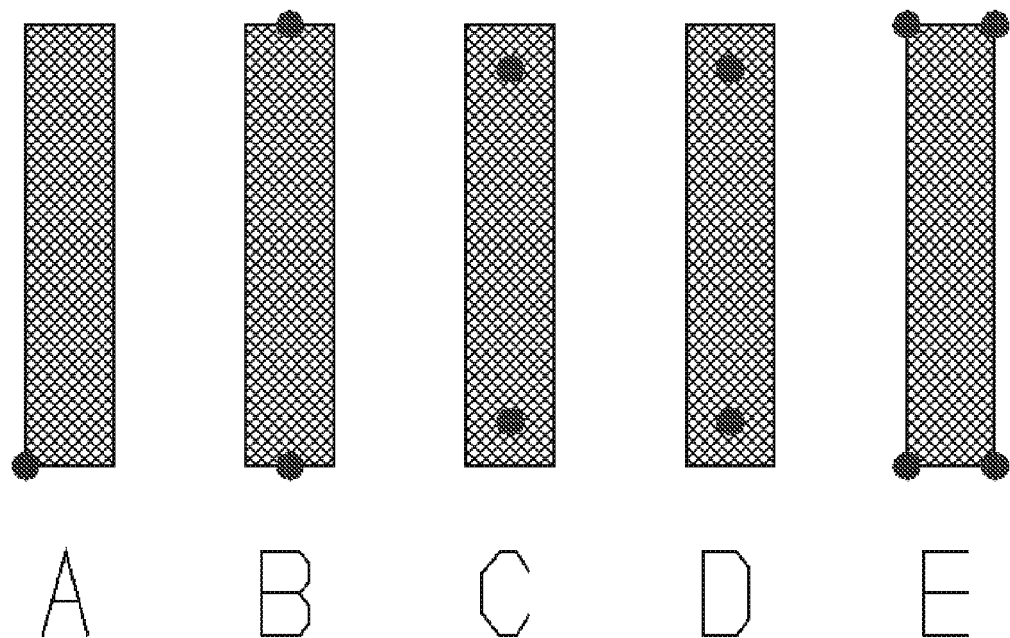
Figure 6D:
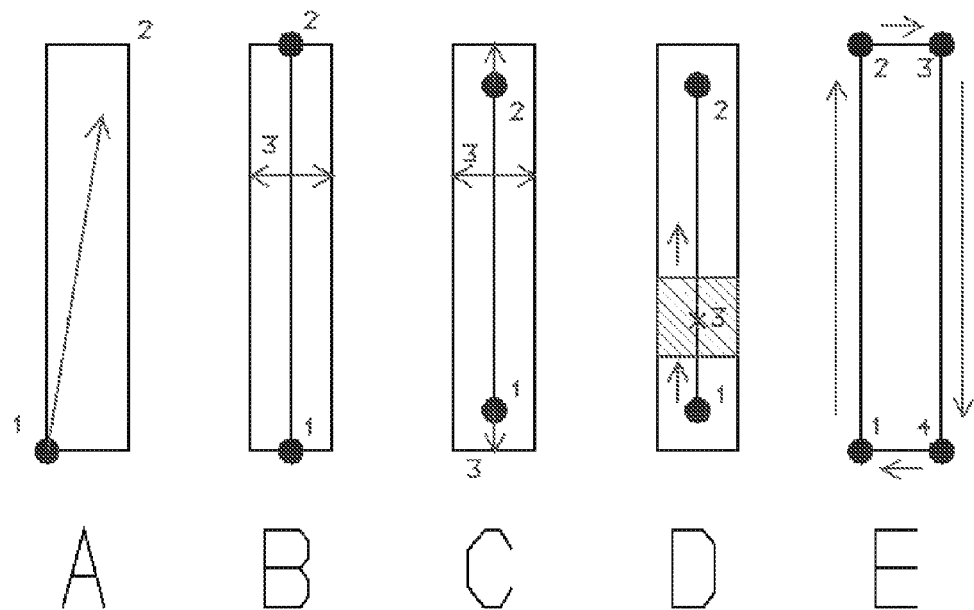
Figure 6E:
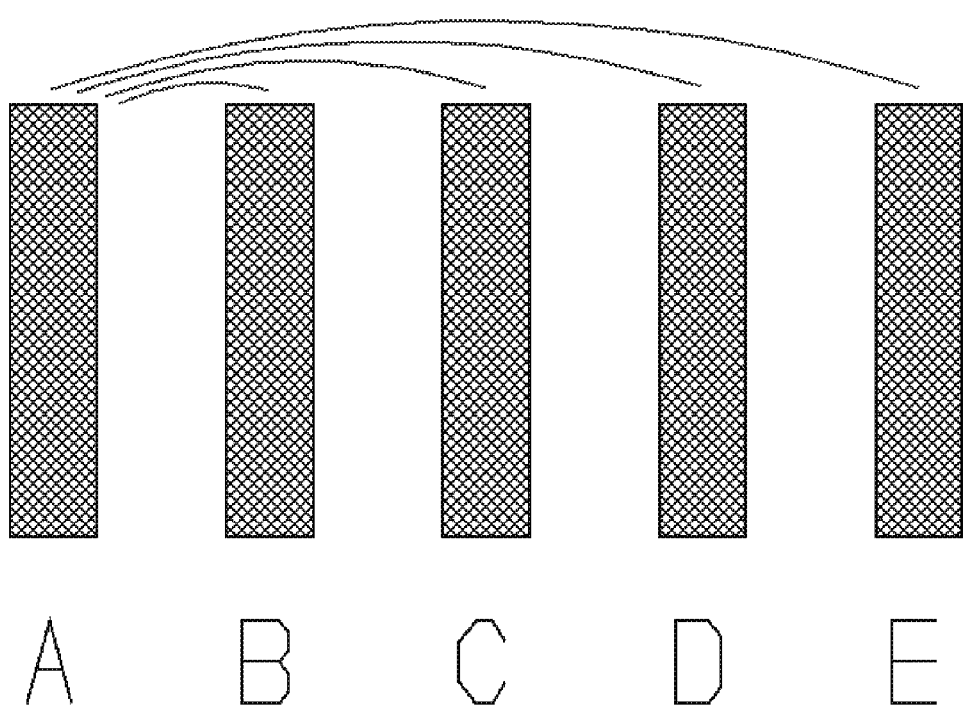

In the example provided herein, the assumption is that the edges described run from 1 to 2; 2 to 3; 3 to 4; 4 to 1 as shown in FIG. 6C. In this example, when any of the shape encodings are shown in FIG. 6D, the processes of the invention automatically maps them to the other encoding methods for the purposes of testing the DRC program's ability to correctly check those encoding variants. Internally, it is not necessary to maintain a complete set of mappings from one encoding method to another, but rather, in embodiments, a base encoding is selected, as shown in FIG. 6E, shown as A, and ensures all other encodings, B, C, D and E can be mapped to that encoding.

Figure 6F:
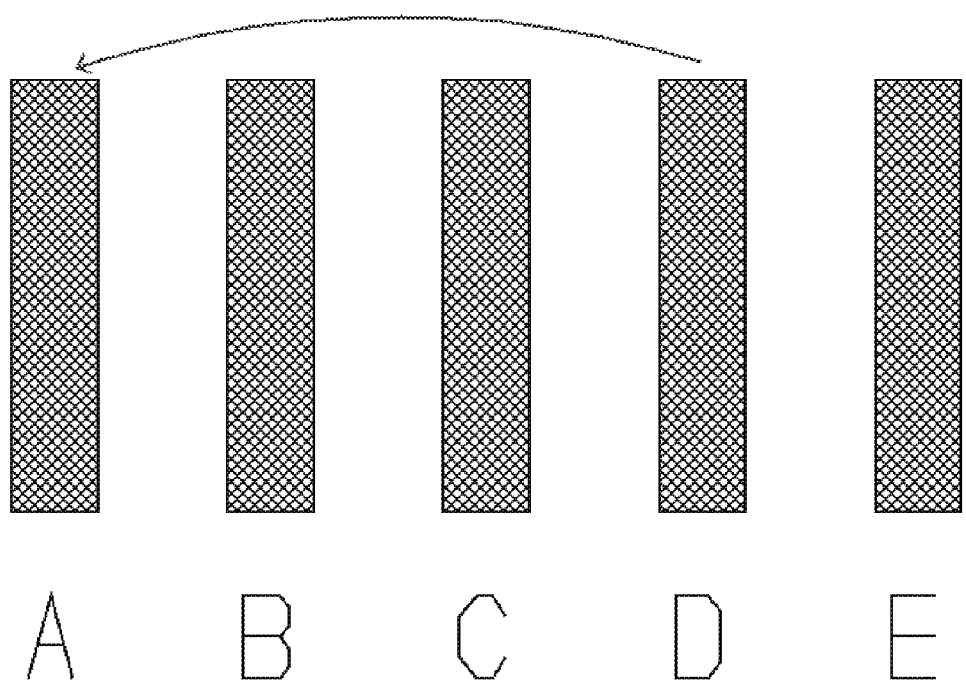

In examples, suppose DRC program test data is checking the width of shapes and one test case encoded with shape description method D. The system and process of the invention uses the mapping described herein to first map encoding D to the base encoding A and to create that shape and place it in the generated data at a parameterized offset from the original shape D, as shown in FIG. 6F.

Figure 6G:
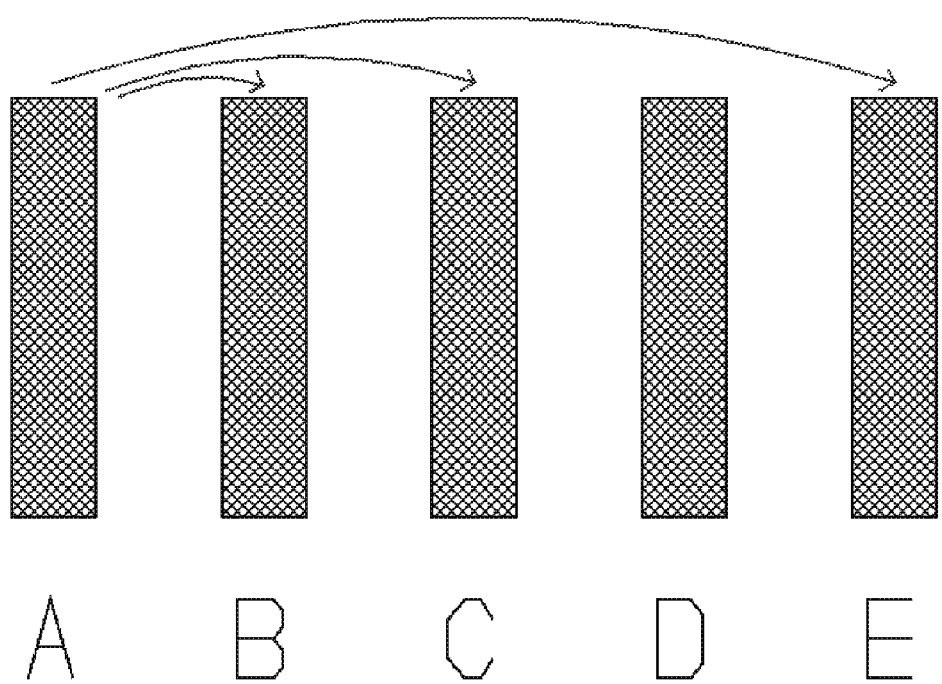

Once the system and process recognizes the base encoding of A, the system and process creates all other encodings for identical shapes maintained in the mapping table less those already marked as existing. In this case, the original D shape need not be generated. Each alternative encoding for the same shape is generated as shown in FIG. 6G and each shape encoding offset from the previous one generated so as not to overlap others.

In embodiments, should encoding A been seen first, the system and process of the invention would recognize it as the base encoding being so marked in a program table and all encodings B, C, D, and E would generate offset from the original A. No matter what encoding is first, all the alternatives are generated prior to testing without having to maintain these encodings in the test case data. It is noted that this example is a simplified to show the structure of the method and program. In application there may be other encoding methods available in the languages being used in the industry to describe the same point set. Further, the system and process of the invention can be extended to encodings for data groupings, mask layers, cell or structure name, etc.

As should now be understood, the present invention is configured to manipulate simpler test data to create more complex and complete test data as a way to better testing coverage for design rule checking programs. In embodiments, three example areas of manipulation include:

1 The insertion/modification of hierarchy aimed to stress the DRC program;
2 The creation of test case variants from simpler data by means of rotation in 2 and 3 dimensional space projected back onto two dimension space; and
3 The creation of geometric language encoding variants from simpler, mainstream formats again aimed at stressing the DRC program.

There are other methods to modify existing test data, as contemplated by the invention. For example, it is often the case a technology uses the same space and width for several masking layers because the tooling being used in manufacturing is the same. It is thus contemplated to create just one set of space and width test cases for one mask layer and then automatically copy these to the other mask layers using the same space and width "rules" in design. In the shapediff methodology and other DRC testing methodologies there is much information imbedded in the test cases to guide the 'shapdiff' process, i.e., how much geometric tolerance to allow in the DRC results, for example. This information could be modified on the fly from simpler maintained test data to better stress and test the DRC program.

While the invention has been described in terms of exemplary embodiments, those skilled in the art will recognize that the invention can be practiced with modifications and in the spirit and scope of the appended claims.

The invention claimed is:

1. A method of validating a design rule checking program, comprising:
   creating a hierarchal structure such that each layer of the hierarchal structure corresponds to a process layer of a device or subregion of a shape;
   inserting the created hierarchical structure into a DRC program using a processor of a computing device;
   running the DRC program at least once with hierarchical optimization options turned off using the processor of the computing device; and
   comparing expected results with actual results using the processor of the computing device, wherein differences between the expected results and the actual results indicate errors in an operation of the DRC program,
   wherein subsequent levels in the hierarchical structure are created using a base shape of a previous level in the hierarchical structure.

2. The method of claim 1, wherein the inserting comprises one of (i) putting each layer or level of the hierarchical structure in a parallel cell nesting structure; (ii) putting one layer or level of the hierarchical structure into a parallel nesting structure; and (iii) fracturing the shape and putting portions of an original design shape into differing nesting structures.

3. The method of claim 1, wherein the comparing is performed as a stand alone program.

4. The method of claim 1, wherein the comparing is implemented as part of hierarchical operations performed at a start of a run of the DRC program.

5. The method of claim 1, wherein the steps of claim 1 take a form of entirely hardware elements, entirely software elements or both hardware and software elements.

6. The method of claim 1, wherein the subregion is encapsulated and placed next to an adjacent encapsulation of another subregion of the shape to provide the hierarchical structure.

7. The method of claim 1, further comprising propagating a change in the base shape to subsequent cells in the hierarchical structure.

8. The method of claim 1, further comprising flattening the layout data and scrubbing the layout data for snapping issues.

9. The method of claim 8, further comprising rotating the layout data by 3d matrix multiplications.

10. The method of claim 1, further comprising rotating the layout design data arbitrarily in three dimensional space.

11. The method of claim 10, wherein the layout design data is rotated by 45 degrees.

12. The method of claim 1, further comprising using all descriptions of the shape when running the DRC program.

13. The method of claim 12, wherein the descriptions of the shape are not maintained in a test case.

14. A method of validating a design rule checking program, comprising:

provifing a DRC program;

providing a first test case;

modifying the first test case by placing the first test case into a hierarchal structure using a processor of a computing device, wherein each layer of the hierarchal structure is built from a single layer of a design or subregion of a shape;

executing the DRC program using the modified first test case as an input using the processor of the computing device; and comparing the DRC program output results with expected results using the processor of the computing device for determining validity of the DRC program when run against hierarchical test data, wherein subsequent levels in the hierarchical structure use a base shape of a previous level in the hierarchical structure and propagating a change in a base cell of the hierarchical structure changes subsequent cells in the hierarchical structure.

15. The method of claim 14, wherein the modifying comprises an insertion of hierarchy into a layout design.

16. The method of claim 15, wherein the modifying comprises rotating an orientation of the layout design.

17. A system of validating a design rule checking program, the system including computer code run on a machine and configured to:

create a hierarchical structure of layout design;

insert the hierarchical structure of layout design into a DRC program;

rotate the layout data about an x and y axis for testing other orientations of a same shape;

run the DRC program at least once with hierarchical optimization options turned off; and compare expected results with actual results, wherein differences between the expected results and the actual results indicate errors in dealing with hierarchy in the DRC program, wherein subsequent levels in the hierarchical structure use a base shape of a previous level in the hierarchical structure and propagating a change in a base cell of the hierarchical structure changes subsequent cells in the hierarchical structure.

18. The system of claim 17, wherein (i) each layer or level of the hierarchical structure is put in a parallel cell nesting structure; (ii) one layer or level of the hierarchical structure is put into a parallel nesting structure; and (iii) options for fracturing the shape and putting portions of an original design shape into differing nesting structures.

\* \* \* \* \*